(12) United States Patent
Mitlehner et al.

(10) Patent No.: US 6,693,314 B2
(45) Date of Patent: Feb. 17, 2004

(54) JUNCTION FIELD-EFFECT TRANSISTOR WITH MORE HIGHLY DOPED CONNECTING REGION

(75) Inventors: Heinz Mitlehner, Uttenreuth (DE); Dietrich Stephani, Bubenreuth (DE); Jenoe Tihanyi, Kirchheim (DE)

(73) Assignee: SiCed Electronics Development GmbH & Co. KG, Erlangen (DE)

( * ) Notice: Subject to any disclaimer, the term of this patent is extended or adjusted under 35 U.S.C. 154(b) by 0 days.

(21) Appl. No.: 09/888,037

(22) Filed: Jun. 22, 2001

(65) Prior Publication Data

US 2002/0014640 A1 Feb. 7, 2002

Related U.S. Application Data

(63) Continuation of application No. PCT/DE99/04019, filed on Dec. 17, 1999.

(30) Foreign Application Priority Data

Dec. 22, 1998 (DE) .......................... 198 59 502

(51) Int. Cl.[7] .............................................. H01L 29/80
(52) U.S. Cl. .................. 257/256; 257/192; 257/263; 257/270; 257/273; 257/287
(58) Field of Search .............................. 257/256, 263, 257/287, 192, 273, 270

(56) References Cited

U.S. PATENT DOCUMENTS

| | | | | |
|---|---|---|---|---|
| 4,296,428 A | * | 10/1981 | Haraszti | 257/331 |
| 4,311,532 A | * | 1/1982 | Taylor | 438/204 |
| 4,568,958 A | * | 2/1986 | Baliga | 257/332 |
| 4,611,235 A | * | 9/1986 | Bhagat | 257/138 |
| 5,077,231 A | * | 12/1991 | Plumton et al. | 438/170 |
| 5,082,795 A | * | 1/1992 | Temple | 438/138 |
| 5,323,040 A | | 6/1994 | Baliga | |
| 5,399,515 A | * | 3/1995 | Davis et al. | 438/270 |
| 5,623,152 A | * | 4/1997 | Majumdar et al. | 257/330 |
| 5,753,938 A | * | 5/1998 | Thapar et al. | 257/77 |
| 5,861,643 A | * | 1/1999 | Chen et al. | 257/256 |
| 5,963,807 A | * | 10/1999 | Ueno | 438/268 |
| 5,973,360 A | * | 10/1999 | Tihanyi | 257/330 |
| 5,998,836 A | * | 12/1999 | Williams | 257/341 |
| 2002/0036319 A1 | * | 3/2002 | Baliga | 257/328 |

FOREIGN PATENT DOCUMENTS

| | | |
|---|---|---|
| DE | 43 09 764 A1 | 9/1994 |
| DE | 43 09 764 C2 | 1/1997 |
| EP | 0 732 734 A2 | 9/1996 |
| WO | WO 97/23911 | 7/1997 |
| WO | WO 98/49733 | 11/1998 |

OTHER PUBLICATIONS

P.M.Shenoy: A Novel P[+]Polysilicon/N[−]SIC Heterojunction Trench Gate Vertical FET, 1997 IEEE, pp. 365–368.

* cited by examiner

*Primary Examiner*—Amir Zarabian
*Assistant Examiner*—Ida M. Soward
(74) *Attorney, Agent, or Firm*—Laurence A. Greenberg; Werner H. Stemer; Ralph E. Locher

(57) ABSTRACT

A junction field-effect transistor containing a semiconductor region with an inner region is described. In addition, a first and a second connecting region, respectively, are disposed within the semiconductor region. The first connecting region has the same conductivity type as the inner region, but in a higher doping concentration. The second connecting region has the opposite conductivity type to that of the inner region. This reduces the forward resistance while at the same time maintaining a high reverse voltage strength.

15 Claims, 5 Drawing Sheets

JUNCTION FIELD-EFFECT TRANSISTOR WITH MORE HIGHLY DOPED CONNECTING REGION

CROSS-REFERENCE TO RELATED APPLICATIONS

This application is a continuation of copending International Application No. PCT/DE99/04019, filed Dec. 17, 1999, which designated the United States.

BACKGROUND OF THE INVENTION

FIELD OF THE INVENTION

The invention relates to a junction field-effect transistor containing at least a gate electrode, a semiconductor region having at least a drain contact region disposed on a first surface of the semiconductor region and formed of a first conductivity type, a control region formed of a second conductivity type and an inner region formed of the first conductivity type. The transistor further has a source contact region formed of the first conductivity type, the control region and the inner region being at least partly disposed between the source contact region and the drain contact region.

Such a junction field-effect transistor is disclosed in International Patent Disclosures WO 97/23911 A1 and WO 98/49733 A1. Each of the two documents describes a normally on junction field-effect transistor (JFET) which can be used to control a current flow between two electrodes. In particular, with the aid of the JFET, the current is switched on and off or else limited to a maximum value. On the other hand, the JFET is able to take up the reverse voltage of more than 1000 V that arises in the reverse-biasing situation. Owing to the high breakdown strength of silicon carbide (SiC) the JFET is preferably composed of corresponding monocrystalline semiconductor material. The JFET contains a buried island region that functions as a control region and effects field shielding of one electrode.

In a unipolar transistor, such as the JFET, the dielectric strength is determined inter alia by the doping of an inner region that carries a large part of the reverse voltage in the reverse-biasing situation and carries the current in the forward-biasing situation. The inner region is also referred to as a drift zone. The higher the values that are to be assumed by the reverse voltage to be carried, the lower the doping of the inner regions must be chosen. On the other hand, in order to ensure, in the forward-biasing situation, that current is transported through the inner region in a manner as free from losses as possible, the doping should, by contrast, be as high as possible.

The contrary effects described mean, for example, that a power transistor realized in silicon, such as e.g. a voltage-controlled Si-MOSFET (Metal Oxide Semiconductor Field Effect Transistor) or else an Si-JFET, is usually realized only for a maximum reverse voltage of a few 100 V. When the doping is configured for a higher reverse voltage, the static on-state losses and, consequently, the risk of disruption of the transistor through overheating greatly rise.

Furthermore, German Patent DE 43 09 764 C2 (which corresponds to U.S. Pat. No. 5,438,215) discloses a normally off power MOSFET which can block a voltage of more than 1000 V. In order to reduce the forward resistance in the MOSFET, additional p-doped and n-doped zones are provided in the inner region, the zones having a higher doping concentration than the inner region. This results in suitability for a high reverse voltage in conjunction with low static on-state losses. In this case, the configuration features specified can only relate to a MOSFET. This is because, in contrast to a JFET, a MOSFET always requires a control oxide in order to influence the current flow. The specific properties of the control oxide, in particular the maximum permissible field strength, likewise have an influence on the maximum possible reverse voltage. In the MOSFET configuration, therefore, care must also be taken to ensure that impermissibly high field spikes are not produced in the control oxide in the reverse-biasing situation. This occasionally has the effect that the material properties of the semiconductor material can only be utilized in part, on account of the stipulations necessitated by the control oxide.

SUMMARY OF THE INVENTION

It is accordingly an object of the invention to provide a junction field-effect transistor with a more highly doped connecting region that overcomes the above-mentioned disadvantages of the prior art devices of this general type. The invention specifies a power transistor that is at the same time suitable for a high reverse voltage and, in addition, has low static losses in the forward-biasing situation. Furthermore, the intention is for the power transistor to manage without a control oxide.

With the foregoing and other objects in view there is provided, in accordance with the invention, a junction field-effect transistor. The JFET contains a semiconductor region having a first surface and a second surface opposite the first surface. The semiconductor region includes a drain contact region disposed at the first surface of the semiconductor region and formed of a first conductivity type; an inner region disposed above the drain contact region and formed of the first conductivity type; and a control region disposed above the inner region and formed of a second conductivity type. A gate electrode is disposed above the control region.

A source contact region is provided and is formed of the first conductivity type. The control region and the inner region are at least partly disposed between the source contact region and the drain contact region. A first connection region formed of the first conductivity type is provided. The first connection region has at least one inner part running within the semiconductor region substantially perpendicularly to the first surface. The first connection region is directly connected to the source contact region in a low-impedance manner and is doped more highly than the inner region. A second connection region formed of the second conductivity type and having at least one inner part running within the semiconductor region substantially perpendicularly to the first surface, is provided. The second connection region compensates for an influence of the first connection region in a reverse-biasing situation.

In this case, the invention is based on the insight that the bulk resistance in the inner region of the junction field-effect transistor (JFET) can be reduced by at least a first connecting region doped more highly than the inner region. The first connecting region has the same conductivity type as the inner region and it extends at least partly into the region of the JFET through which a current flows in the forward-biasing situation. In order to obtain the longest possible current path with a low bulk resistance, the first connecting region is directly connected to the source contact region. In this case, the connection is effected with a low impedance. For the current flowing between the source contact region and the drain contact region in the forward-biasing situation, this results in a path having distinctly lower losses than in the case of a current flow via the more lightly doped inner region.

In the reverse-biasing situation, a lower dielectric strength of the first connecting region, which is caused by the higher doping is nevertheless not realized. This is because the influence of the first connecting region is at least partly compensated for by the second connecting region having the second conductivity type. At a high reverse voltage, there are practically no longer any free charge carriers present in the inner parts of the first and second connecting regions. This is because they are completely depleted above a specific value of the reverse voltage, with the result that only the space charges remain. As a result, the equipotential lines of the electric field, above the reverse voltage value, run practically parallel to the first surface through the semiconductor region. Thus, an electric field distribution is established as if the connecting regions were actually not present. Consequently, reverse-biasing behavior of the JFET is not impaired by the above-described measure for reducing the bulk resistance in the forward-biasing situation. The maximum reverse voltage that can be carried by the JFET is determined according to the doping of the inner region, exactly as in the case of the prior art.

In the JFET, the current flow is controlled through at least one depletion layer between semiconductor regions having an opposite conductivity type. A control oxide is not necessary for this purpose. The field spikes in the control oxide that are possible in a MOSFET cannot occur, in principle, in the JFET.

A preferred embodiment relates to the configuration of the inner parts of the first and second connecting regions within the semiconductor region. Situated in the semiconductor region is a recess which, proceeding from a second surface of the semiconductor region, extends into the semiconductor region. In this case, the second surface is disposed on a side of the semiconductor region that is opposite to the first surface. By way of example, the recess may be etched in the form of a trench into the semiconductor region. The inner parts of the first and second connecting regions are introduced into the trench. This can be done either by way of epitaxial growth of undoped or only weakly doped layers with subsequent ion implantation or else by way of direct epitaxial growth corresponding to n-doped and p-doped layers. In accordance with the current flow between the source contact region and the drain contact region through the semiconductor region, both the trench and, situated in it, the inner parts of the first and second connecting regions run perpendicularly to the first surface of the semiconductor region.

Also advantageous is an embodiment of the junction field-effect transistor in which the at least one inner part of the first connecting region adjoins edges of the recess. In this case, the inner part of the first connecting region can be disposed in direct proximity both to the lateral edges and to the lower edge of the recess. As a result, the inner part of the first connecting region adjoins the inner region of the semiconductor region, which has the same conductivity type although in a weaker doping concentration. This results in a more favorable field distribution and better coupling than in the case of an embodiment in which the at least one inner part of the second connecting region adjoins edges of the recess.

An advantageous embodiment of the junction field-effect transistor is distinguished by the fact that for each inner part running perpendicularly to the first surface of the first connecting region there exists an inner part running parallel thereto—of the second connecting region. The effect achieved by this assignment is that the most optimal compensation possible of space charges within the two connecting regions takes place in the reverse-biasing situation. As a result, the advantageous course of the equipotential lines, the course being directed parallel to the first surface, is then established within the entire semiconductor region.

The aforesaid compensation of reciprocal space charges between the two connecting regions is additionally optimized in a further advantageous embodiment by the mutually assigned inner parts of the first and second connecting regions directly adjoining one another. The nearer the corresponding space charge zones having opposite polarity are to one another, the better the compensation.

In another advantageous refinement, the first connecting region extends as far as the drain contact region, which, for its part, adjoins the first surface of the semiconductor region. As a result, the drain contact region is also connected to the first connecting region in a low-impedance manner. The result is a continuous current path between the source contact region and the drain contact region, which has a higher doping and thus a lower bulk resistance than the inner region. The above-described reciprocal compensation of space charges between the first and the second connecting region results in that the reverse-biasing behavior is not impaired in this advantageous refinement either.

Also advantageous is an embodiment in which at least the inner part of the first connecting region has a doping concentration that at least largely corresponds to the breakdown charge of the semiconductor material used. In this connection, the breakdown charge is understood to be that space charge which is necessary in order that a maximum field strength forms at a p-n junction, the maximum field strength corresponding to the critical field strength of the semiconductor material used. If the field strength rises above this material-specific value of the critical field strength, then a so-called avalanche breakdown occurs. The above-mentioned term "breakdown charge" is derived from this. The maximum field strength that forms is proportional to the doping concentration that determines the space charge. Therefore, the inner part of the first connecting region thus has its maximum permissible doping concentration precisely when it is doped in accordance with the critical field strength or, this being analogous thereto, in accordance with the breakdown charge. Since the drift resistance decreases with rising doping concentration, the minimum possible static on-state losses are also obtained with the above-mentioned doping concentration.

In an advantageous refinement of the junction field-effect transistor, at least the inner part of the second connecting region has a doping concentration that at least largely corresponds to that of the inner part of the first connecting region. The effect achieved by an identical doping concentration in both connecting regions is that, at maximum reverse voltage, each stationary space charge of one connecting region can be assigned a space charge zone of the other connecting region. This results in the greatest possible reciprocal compensation.

In another advantageous embodiment, the junction field-effect transistor is at least partly composed of a semiconductor material that has an energy gap of at least 2 eV. Examples of such a semiconductor material are diamond, gallium nitride (GaN), indium phosphide (InP) and silicon carbide (SiC). The latter, especially, is particularly well suited on account of the extremely low intrinsic charge carrier concentration (=charge carrier concentration without doping) and the very low material-specific on-state losses. The above-mentioned semiconductor materials additionally have a distinctly higher breakdown strength in comparison with the "universal semiconductor" silicon (Si). Therefore, given an otherwise identical geometry, a JFET realized with one of the abovementioned semiconductors can carry a higher reverse voltage than an Si-JFET. The preferred semiconductor material is silicon carbide, in particular monocrystalline silicon carbide of the 3C, 4H, 6H or 15R polytype, since SiC has outstanding electronic and thermal properties.

In a junction field-effect transistor made of silicon carbide, the inner part of the first connection region preferably has a doping concentration of at most $1 \cdot 10^{13}$ cm$^{-2}$. In this case, the value is related to a fictitious area disposed perpendicular to the first surface.

In principle, the junction field-effect transistor can, however, also be realized with the semiconductor material silicon. Silicon is a highly available semiconductor material that can be obtained in extremely good monocrystalline quality. Moreover, the power loss that can be attained with silicon for a predetermined maximum reverse voltage is small enough for many applications of power electronics.

In the case of a realization of the junction field-effect transistor in silicon, the first connecting region has a preferred doping concentration of at most $1.5 \cdot 10^{12}$ cm$^{-2}$. This concentration is once again related to a fictitious area that runs perpendicularly to the first surface.

Preference is given to an embodiment in which the control region extends along a second surface of the semiconductor region. The second surface is situated on a side of the semiconductor region that is opposite to the first surface.

An advantageous embodiment of the junction field-effect transistor is one in which the gate electrode makes ohmic contact both with the control region and with the second connecting region. This opens up the possibility of influencing the current flow and also the field distribution by a single control potential present at the common gate electrode.

The junction field-effect transistor is advantageously configured in such a way that a layer stack containing an outer part of the first connecting region, the source contact region and an outer part of the second connecting region is disposed on the semiconductor region above the control region. In this case, the outer part of the first connecting region adjoins the semiconductor region. Furthermore, the layer stack is advantageously constructed in such a way that a projection of the control region and a projection of the outer part of the second connecting region at least partly overlap. In this case, a common direction of the projections runs perpendicularly to the first surface. In the region of overlap, a channel zone is then produced within the source contact region and the outer part of the first connecting region, via which channel zone the current flow can be controlled. Space charge zones (=depletion layer zones) which bound the channel zone form at p-n junctions between the outer part of the second connecting region and the source contact region and also between the control region and the outer part of the first connecting region. The extent of the space charge zones and thus the current flow can be influenced by a control potential present at the second connecting region and the control region.

Other features which are considered as characteristic for the invention are set forth in the appended claims.

Although the invention is illustrated and described herein as embodied in a junction field-effect transistor with more highly doped connecting region, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
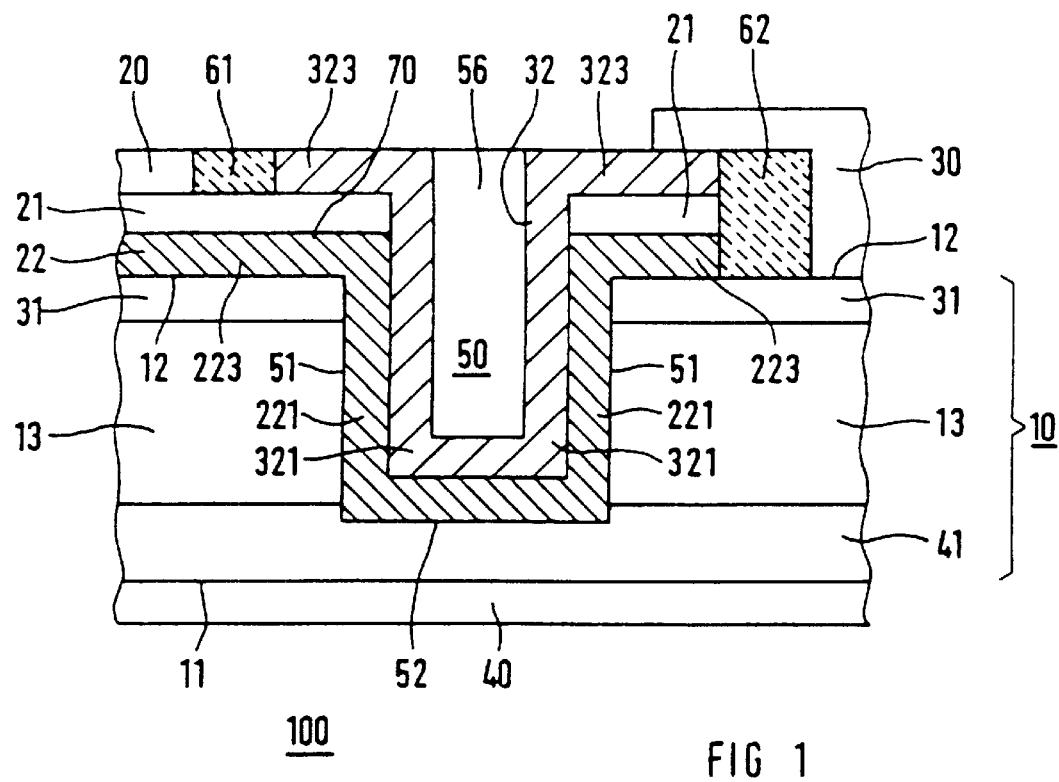
FIG. 1 is a diagrammatic, sectional view of a junction field-effect transistor with a more highly doped connecting region according to the invention.

In all the figures of the drawing, sub-features and integral parts that correspond to one another bear the same reference symbol in each case. Referring now to the figures of the drawing in detail and first, particularly, to FIG. 1 thereof, there is shown a normally on junction field-effect transistor (JFET) 100, which essentially contains a semiconductor region 10 and various semiconducting layers and electrodes applied thereon. The semiconductor region 10 is composed of a highly n-doped drain contact region 41, a lightly n-doped inner region 13 and a highly p-doped control region 31 disposed above the latter.

Contact is made with the drain contact region 41 by a drain electrode 40 on a first outer side or surface 11 of the semiconductor region 10. Situated on a second surface 12—opposite to the first surface 11—of the semiconductor region 10 is a recess 50, which reaches into the semiconductor region 10 in the form of a trench 50. The recess 50 has lateral edges 51 and a lower edge 52. The lower edge 52 lies in the region of the drain contact region 41.

A first connecting region 22 projects into an interior of the recess 50. It is n-doped and contains inner parts 221 that in each case run perpendicularly to the first surface 11 along the lateral edges 51 of the recess 50. Outside the recess 50, an outer part 223 of the first connecting region 22 is situated above the control region 31. A source contact region 21 is disposed on the outer part 223 of the first connecting region 22, contact being made with the source contact region 21 by a source electrode 20 on one side of the recess 50.

A second connecting region 32 is provided in the interior of the recess 50 in a manner adjoining the first connecting region 22. The second connecting region 32 once again contains inner parts 321 which likewise run perpendicularly to the first surface 11 of the semiconductor region 10, and also an outer part 323 disposed on the source contact region 21. The second connecting region 32 is p-doped. A first insulation region 61 is provided on the source contact region 21, between the source electrode 20 and the outer part 323 of the second connecting region 32. A gate electrode 30 is situated on that side of the recess 50 that is remote from the source electrode 20. The gate electrode 30 makes contact both with the control region 31 on the second surface 12 of the semiconductor region 10 and the second connecting region 32 on its outer part 323. A second insulation region 62 prevents electrical contact between the source contact region 21 and the gate electrode 30.

In the region of the recess 50, the second connecting region 32 encloses a filling zone 56 filled with undoped semiconductor material. Instead of undoped semiconductor material, however, it is equally possible to use weakly doped semiconductor material.

In the exemplary embodiment illustrated, silicon carbide (SiC) is provided as a semiconductor material for all the semiconducting regions. On account of its outstanding properties, the semiconductor material is suitable particularly when, as in the present case, a high reverse voltage strength, in particular above 1000 V, is demanded. The reverse voltage strength is determined in particular by the geometrical dimensioning and also by the doping concentration of the inner region 13. The higher the doping concentration is chosen to be, the lower a maximum reverse voltage $U_{max}$ that can be carried by the junction field-effect transistor 100. The dependence of the maximum reverse voltage $U_{max}$ on the doping concentration of the inner region 13 is illustrated by the following details. For a maximum reverse voltage $U_{max}$ of about 60 V, the inner region 13 is doped to an order of magnitude of about $2 \cdot 10^{17}$ cm$^{-3}$, and for a maximum reverse voltage $U_{max}$ of about 700 V, it is doped to an order of magnitude of about $2 \cdot 10^{16}$ cm$^{-3}$, and for a maximum reverse voltage $U_{max}$ of about 1200 V, it is doped to an order of magnitude of about $6 \cdot 10^{15}$ cm$^{-3}$. In order to enable a junction between the semiconducting regions and the electrodes which has the lowest possible impedance, a doping concentration of above $1 \cdot 10^{19}$ cm$^{-3}$ is provided, in particular, for the source contact region 21 and the drain contact region 11. The control region 31 is doped to an order of magnitude of between $1 \cdot 10^{18}$ cm$^{-3}$ and $2 \cdot 10^{19}$ cm$^{-3}$. Preferred dopants in SiC are boron and aluminum for p-type doping and nitrogen for n-type doping. All the above-mentioned doping concentrations apply in each case to the semiconductor material silicon carbide.

In another exemplary embodiment (not illustrated), in which e.g. a lower maximum reverse voltage $U_{max}$ is demanded, it is also possible, however, to use silicon as the semiconductor material. In this case, the doping concentrations specified above for SiC should generally be divided in each case by about 100 (lower by two orders of magnitude).

The first and second insulation regions 61 and 62 contain an insulation layer, in particular an oxide layer. The dielectric silicon dioxide ($SiO_2$) is preferably used for the insulation layer, the dielectric being grown thermally, in particular. Thermal oxide has outstanding insulation properties and, in particular, can also be produced on silicon carbide by a dry or wet oxidation at temperatures above 1000° C. However, it is also possible to use another dielectric, such as e.g. the non-oxidic silicon nitride ($Si_3N_4$), for the insulation layer.

In the junction field-effect transistor 100 illustrated, the two insulation regions 61 and 62 each serve exclusively for electrical insulation. They have no function comparable to the control oxide of a MOSFET in the context of current control. As a result, the question of impermissibly high values of the electrical field strength within these two insulation regions 61 and 62 does not have a crucial part to play. Consequently, it is then also the case that the quality of the insulation regions 61 and 62 is not accorded comparably high importance as in the case of a MOSFET. Since the two insulation regions 61 and 62 are not relevant to the current control, the junction field-effect transistor 100 is also largely independent of temperature in respect of its current control behavior. In contrast, a MOSFET has a distinctly higher temperature sensitivity essentially brought about by the control oxide.

Appropriate materials for the source electrode 20, the drain electrode 40 and the gate electrode 30 are polysilicon or a metal, preferably nickel (Ni), aluminum (Al), tantalum (Ta), titanium (Ti) or tungsten (w). Furthermore, the electrode material used may also be a compound or an alloy that contains one of the metals mentioned above. The electrode material is applied either by vapor deposition or by sputtering.

For a current flow via the junction field-effect transistor 100 between the source electrode 20 and the drain electrode 40, the n-doped first connecting region 22 is essentially provided. This region is doped in accordance with the breakdown charge of silicon carbide. The breakdown charge is a material-specific quantity and is linked to the critical electric field strength in the semiconductor material above which an avalanche breakdown can occur.

The critical field strength of SiC is about 2 MV/cm. In the case of a realization in SiC, at least the inner parts 221 of the connecting region 22 then have, relative to an area which is perpendicular both to the first surface 11 and to the plane of the drawing of FIG. 1, a doping concentration of about $1 \cdot 10^{13}$ cm$^{-2}$ corresponding to the critical field strength.

In contrast, in the case of a realization (not explicitly illustrated) of the JFET in silicon (Si) the inner parts 221 of the connecting region 22 have a doping concentration of about $1.5 \cdot 10^{12}$ cm$^{-2}$ corresponding to the critical field strength of silicon.

If, in the case of the SIC-JFET of FIG. 1, the above-mentioned doping concentration relative to an area is multiplied by the corresponding geometrical extent in the direction of the normal to the surface, in the exemplary embodiment of FIG. 1, this corresponds to the thickness of the connecting region 22 within the recess 50, then a spatial doping concentration of about $1 \cdot 10^{18}$ cm$^{-3}$ is obtained. A thickness of the first connecting region 22 of 100 nm is taken as a basis in this case. The doping concentration is distinctly above the doping concentration of the inner region 13, the latter doping concentration being crucial for the maximum reverse voltage $U_{max}$. A maximum reverse voltage $U_{max}$ of 2000 V, for example, requires a doping concentration of the order of magnitude of $10^{15}$ cm$^{-3}$, in particular of $<5 \cdot 10^{15}$ cm$^{-3}$, in the inner region 13 in SiC.

By virtue of the high doping in the first connecting region 22, the drift or else bulk resistance for the electric current in the forward-biasing situation decreases considerably. At the same time, however, the high doping concentration in the first connecting region 22 also has no disadvantageous effects on the reverse-biasing behavior. This is because the second connecting region 32 has, for this purpose, an approximately identical doping concentration to the first connecting region 22, but with a dopant which brings about the opposite conductivity type. The influences of the donor and acceptor atoms in the first and the second connecting region 22 and 32, respectively, then reciprocally compensate for one another in the event of a high reverse voltage value. In this case, both connecting regions 22 and 32 are completely depleted, i.e. there are no longer any free charge carriers existing. The equipotential lines of the electric field then run practically parallel to the first surface 11. As a result, in the reverse-biasing situation, there is no difference in behavior from a junction field-effect transistor without any connecting regions. At the same time, however, the static on-state losses relative to an occupied area in the semiconductor region 10 are considerably reduced by virtue of the more highly doped first connecting region 22. This opens up the possibility of realizing the junction field-effect transistor 100 with a reduced space requirement.

The junction field-effect transistor 100 can be changed over between an on and an off state by a control potential present at the gate electrode 30. A control potential effecting changeover to the off state causes a channel zone 70, which is situated within the source contact region 21 and the outer part 223 of the connecting region 22, to be completely pinched off or covered by space charge zones of p-n junctions. As a result, the channel zone 70 becomes impassable to the electric current. The channel zone 70 is bounded at the outer edges by the control region 31 and by an outer part 323 of the second connecting region 32. If the control region 31 and the outer part 323 of the second connecting region 32 are projected perpendicularly to the first surface 11 of the semiconductor region 10 into a common plane, then the two projections partly overlap. The channel regions 70 lies exactly in the region of the overlap.

In contrast to the junction field-effect transistor 100 shown in FIG. 1, another possible embodiment is one in which the control region 31 is present as a buried island region (=buried gate).

In order to increase the current-carrying capacity, it is also possible, moreover, for a plurality of junction field-effect transistors 100 to be disposed next to one another on a semiconductor substrate. The junction field-effect transistor 100 shown in FIG. 1 then constitutes an individual cell in such a configuration, all the individual cells being connected in parallel on the semiconductor substrate. In addition, the current-carrying capacity can also be increased by providing, within a junction field-effect transistor 100, a plurality of recesses 50 each containing first and second connecting regions 22 and 32, respectively. Moreover, it is possible to dispose a plurality of first and second connecting regions 22 and 32, respectively, in a single recess 50.

FIGS. 2 to 6 illustrate a first method for fabricating the two connecting regions 22 and 32, respectively.

Figure 2:
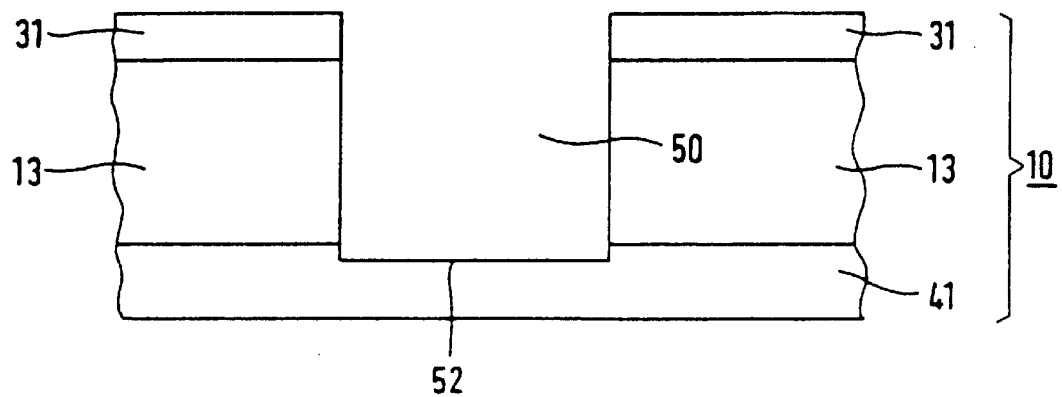
FIGS. 2 to 6 are sectional views of the fabrication of the connecting regions of the junction field-effect transistor by an epitaxial layer growth and a subsequent ion implantation.

The starting point is the semiconductor body that is shown in FIG. 2, forms the semiconductor region 10 of the completed JFET and is hereinafter identified by the reference symbol thereof. It already contains the various dopings for the drain contact region 41, the inner region 13 and the control region 31. By use of the trench technique known from memory technology, the recess 50 is etched into the semiconductor body 10 with a predetermined depth. The lower edge 52 of the recess 50 is situated within the drain contact region 41. In this case, the depth of the recess 50 depends both on the semiconductor material used and on the demanded maximum reverse voltage $U_{max}$, since these parameters determine the geometrical dimensioning of the inner region 13. For a maximum reverse voltage $U_{max}$ of about 2000 V and the SiC used here, the depth of the recess 50 which is determined by the inner region 13 is at least about 20 $\mu$m. For a junction field-effect transistor 100 (not illustrated) made of the semiconductor material silicon and dimensioned for example for a maximum reverse voltage $U_{max}$ of about 600 V, the depth of the recess 50 is at least 50 $\mu$m. In the case of a higher maximum reverse voltage $U_{max}$, a correspondingly larger inner region 13 is required to reduce the reverse voltage. In an Si-JFET, therefore, the depth of the recess 50 may also be more than 80 $\mu$m.

Figure 3:
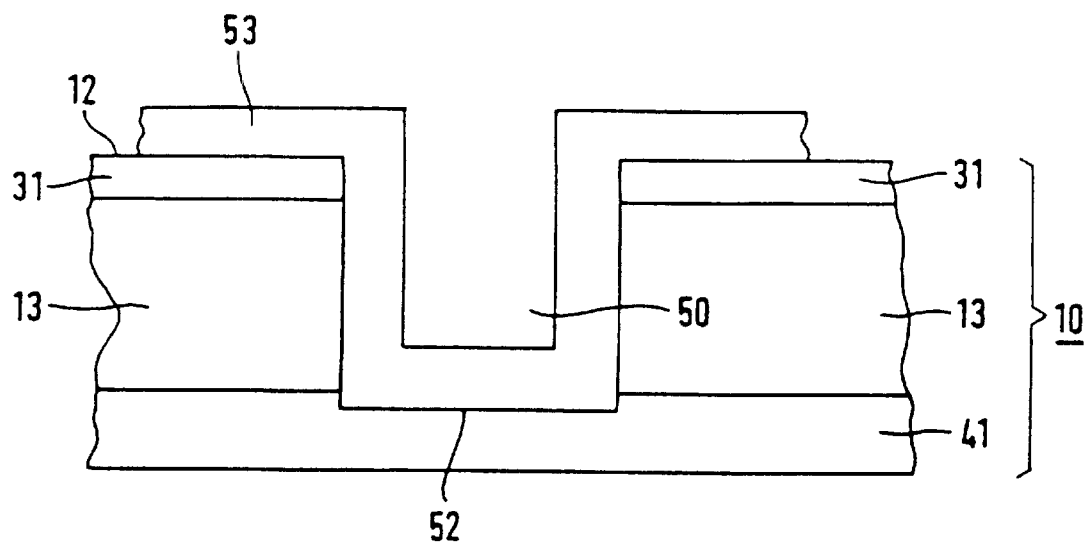

Proceeding from the semiconductor body 10 with an etched-in recess 50 as illustrated in FIG. 2, it is possible to grow a first undoped epitaxial layer 53 made of the basic material for the first connecting region 22 in the recess 50 and on the second surface 12 (see FIG. 3). Instead of an undoped epitaxial layer, a weakly doped epitaxial layer may also be applied.

Figure 4:
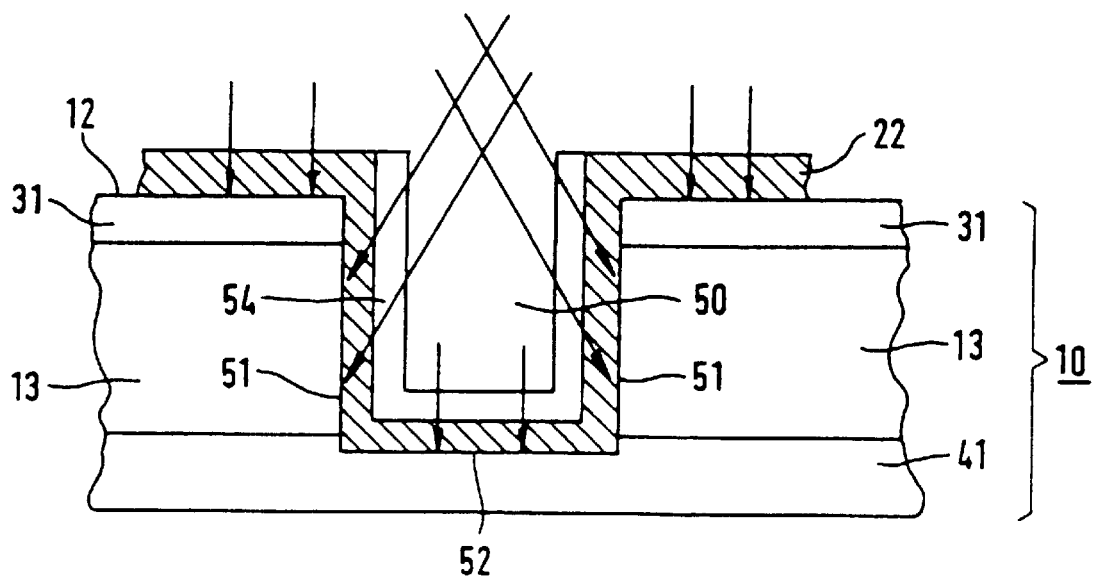

FIG. 4 illustrates a subsequent ion implantation of the first undoped epitaxial layer 53. The n-doped first connecting region 22 is produced as a result. In this case, the ion implantation takes place with different angles of inclination with respect to the second surface 12 of the semiconductor body 10. The regions of the first undoped epitaxial layer 53 which are situated on the second surface 12 of the semiconductor body 10 and on the lower edge 52 of the recess 50 are implanted perpendicularly to the second surface 12. By contrast, the regions of the first undoped epitaxial layer 53 that adjoin the lateral edges 51 of the recess 50 are doped by inclined implantation. The direction of effect of the ion implantation is indicated by the arrows in FIG. 4.

The inclined implantation has the consequence that the width of the recess 50 also increases as the depth increases. Thus, the smallest possible depth of the recess 50 is favorable in the sense of the smallest possible space requirement. In this respect, a junction field-effect transistor 100 realized in SiC affords advantages since it manages with relatively shallow trench etching even in the case of a high maximum reverse voltage $U_{max}$. For a maximum reverse voltage $U_{max}$ of 2000 V, for example, the recess 50 in SiC only has a depth of 20 $\mu$m.

Within the recess 50, the ions are implanted into the undoped first epitaxial layer 53 in such a way that the n-doped first connecting region 22 is formed only in direct proximity to the lateral edges 51 and the lower edge 52 of the recess 50. By contrast, a region of the first undoped epitaxial layer 53 which is remote from the edges 51 and 52 of the recess 50 remains undoped and forms an intermediate zone 54, since practically no diffusion of dopants takes place in SiC at a temperature of $\leq 1700°$ C.

Figure 5:
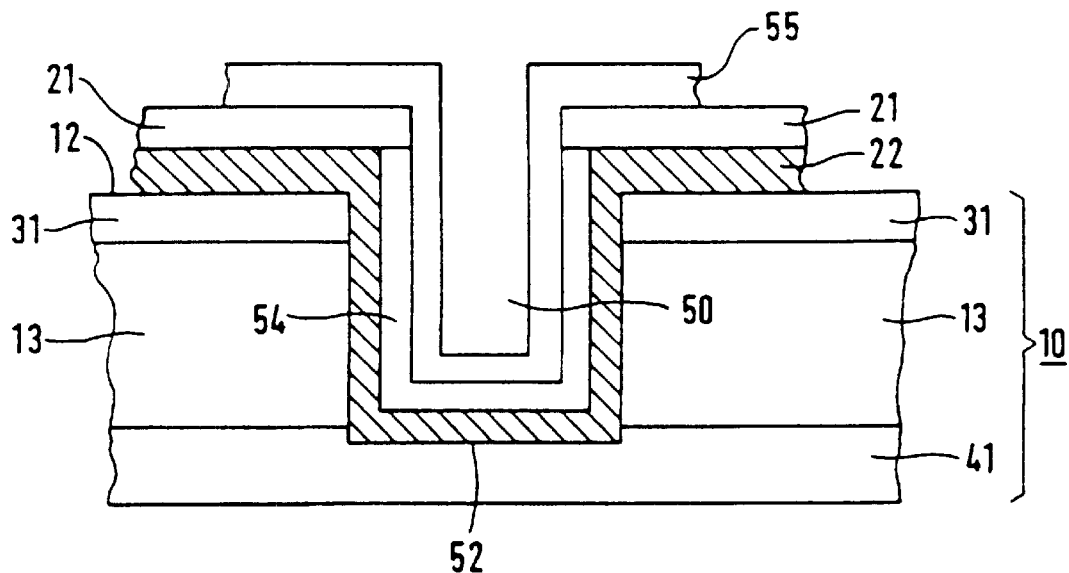

Outside the recess 50, the n-doped source contact region 21 is epitaxially applied to the first connecting region 22. Afterward, a further undoped second epitaxial layer 55 can be grown on the source contact region 21 and the intermediate zone 54 (FIG. 5).

Figure 6:
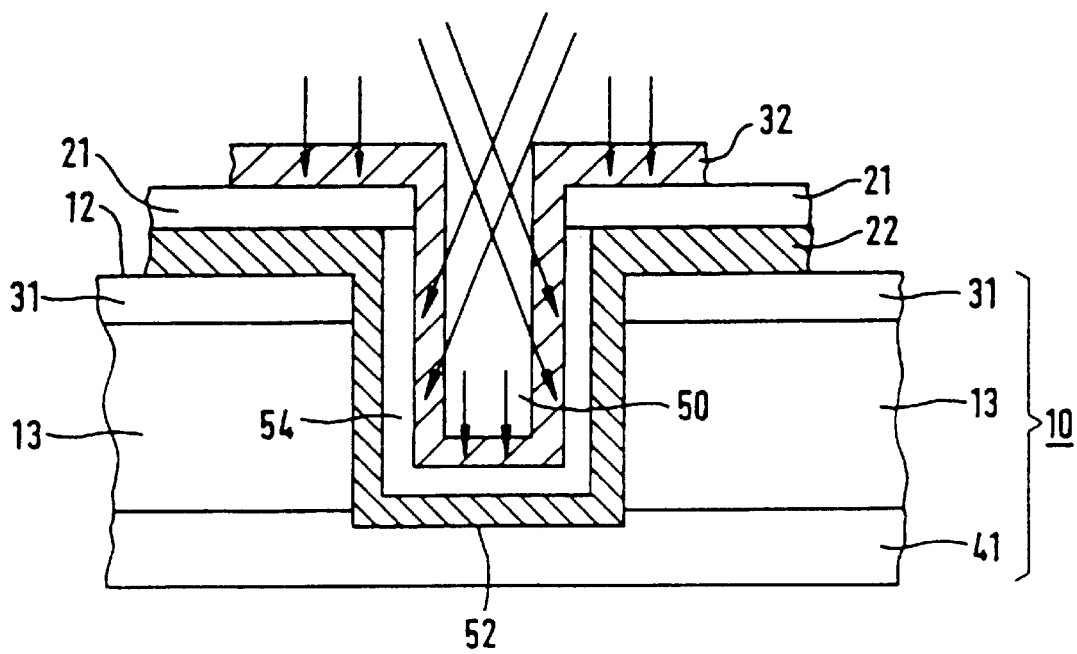

FIG. 6 illustrates the p-doping of the second undoped epitaxial layer 55 by ion implantation. In this case, the ion implantation with acceptors is effected analogously to the ion implantation with donors which is illustrated in FIG. 4. After a heat treatment which is carried out, if appropriate, in order to activate the implanted ions and in order to anneal lattice defects that have been produced, the n-doped first connecting region 22 and the p-doped second connecting region 32 are then present. The intermediate zone 54 disposed between the two connecting regions 22 and 32 is not absolutely necessary. It merely facilitates the setting of the adjacent doping profiles with a respectively different conduction type during the implantation.

Figure 7:
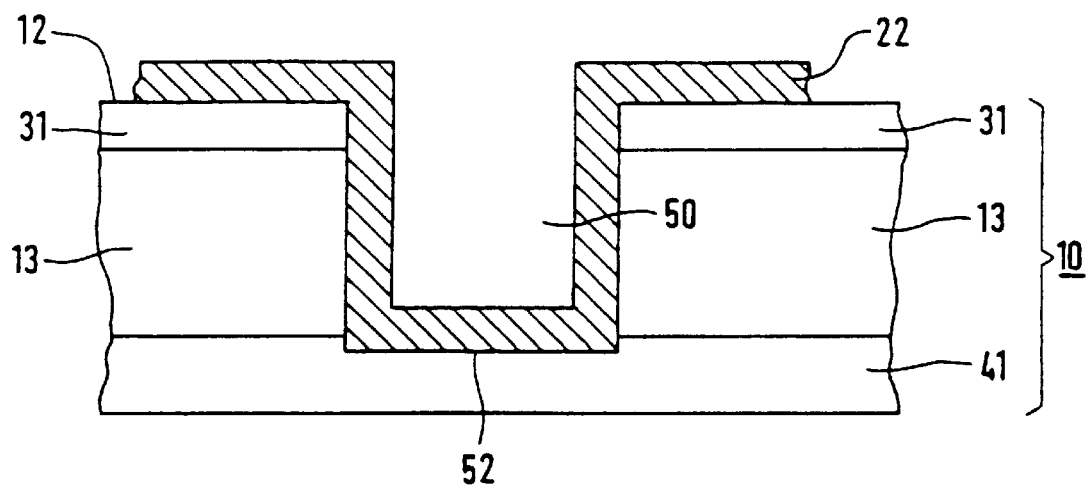
FIGS. 7 and 8 are sectional views of the fabrication of the connecting regions of the junction field-effect transistor by epitaxial growth of doped layers.
Figure 8:
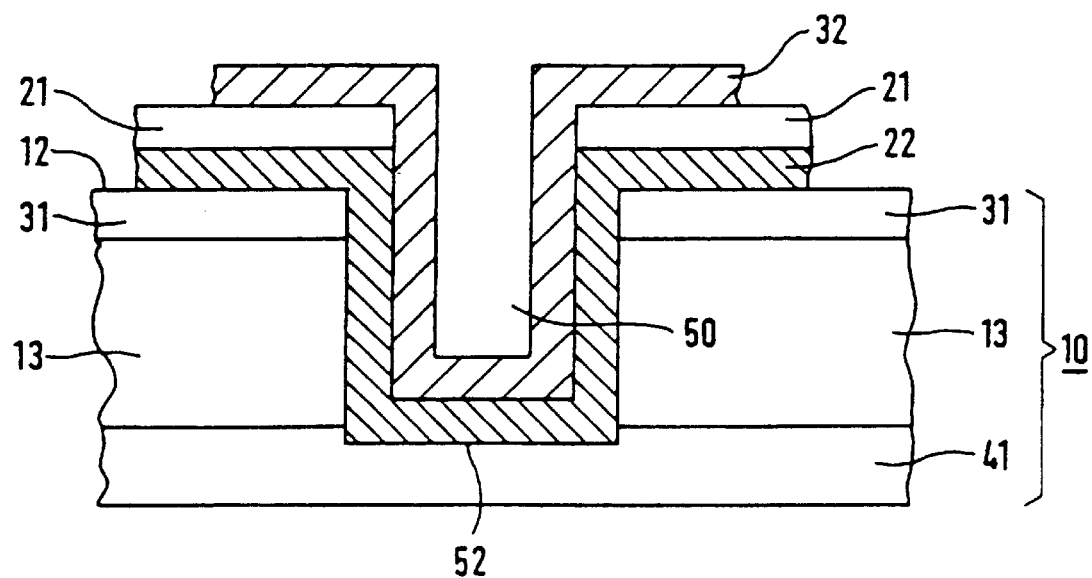

FIGS. 7 and 8 illustrate an alternative method for fabricating the two connecting regions 22 and 32. Proceeding from the basic body shown in FIG. 2, the first connecting region 22 is applied directly in the form of an n-doped epitaxial layer (FIG. 7). The epitaxial growth of the source contact region 21 then follows. Afterward, the second connecting region 32 is applied in the form of a p-doped epitaxial layer (FIG. 8). No implantation steps are provided in this fabrication method.

Figure 9:
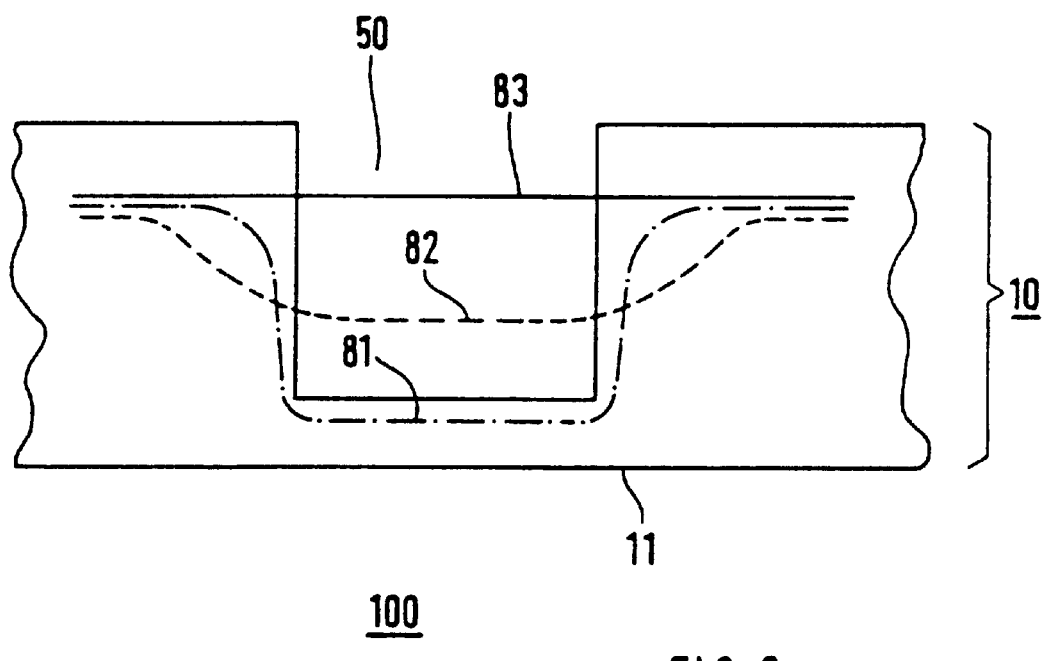
FIG. 9 is a sectional view showing equipotential lines within the junction field-effect transistor shown in FIG. 1 for various reverse voltages.

FIG. 9 illustrates, from the junction field-effect transistor 100, the semiconductor body 10 with the recess 50. Equipotential lines 81, 82 and 83 of the electric field strength for various reverse voltages are additionally depicted in this diagrammatic representation. A first equipotential line 81 (dash-dotted line) symbolizes the profile of the electric field strength for a low reverse voltage ($\leq 0.1 \cdot U_{max}$). A second equipotential line 82 (dashed line) reproduces the field profile for an average reverse voltage ($0.2 \cdot U_{max}$ to $0.6 \cdot U_{max}$). A third equipotential line 83 (solid line), which essentially runs parallel to the first surface 11 of the semiconductor body 10, finally shows the field conditions for a high reverse voltage ($0.7 \cdot U_{max}$ to $1 \cdot U_{max}$). It becomes clear from the profile of the third equipotential line 83 that the first and second connecting regions 22 and 32, respectively, which are not illustrated in FIG. 9, have no influence on the reverse-biasing behavior.

It is understood that the specified conductivity types of all the semiconductor regions mentioned can also be interchanged in each case.

We claim:

1. A junction field-effect transistor, comprising:
   a semiconductor region having a first surface and a second surface opposite said first surface, said semiconductor region including:
      a drain contact region disposed at said first surface of said semiconductor region and formed of a first conductivity type;
      an inner region disposed above said drain contact region and formed of said first conductivity type; and
      a control region disposed above said inner region and formed of a second conductivity type;
   a gate electrode disposed above said control region;
   a source contact region formed of said first conductivity type, said control region and said inner region being at least partly disposed between said source contact region and said drain contact region;
   a first connection region formed of said first conductivity type, said first connection region having at least one inner part running within said semiconductor region substantially perpendicularly to said first surface, said first connection region directly connected to said source contact region in a low-impedance manner and being doped more highly than said inner region forming a current path between said source contact region and said drain contact region having lower losses in a forward-biasing situation than for a current flow via said inner region; and
   a second connection region formed of said second conductivity type and having at least one inner part running within said semiconductor region substantially perpendicularly to said first surface, said second connection region compensating for an influence of said first connection region in a reverse-biasing situation.

2. The junction field-effect transistor according to claim 1, wherein said semiconductor region has a recess formed therein, said recess extending from said second surface of said semiconductor region into said semiconductor region and within said recess said inner part of said first connection region and said inner part of said second connection region are disposed and run perpendicularly to said first surface.

3. The junction field-effect transistor according to claim 2, where said inner part of said first connection region adjoins edges of said recess.

4. The junction field-effect transistor according to claim 1, wherein said inner part of said first connection region runs perpendicularly to said first surface and is assigned said inner part of said second connection region and runs parallel to said inner part of said second connection region.

5. The junction field-effect transistor according to claim 4, wherein said inner part of said first connection region directly adjoins said inner part of said second connection region.

6. The junction field-effect transistor according to claim 1, wherein said first connection region extends as far as said drain contact region.

7. The junction field-effect transistor according to claim 1, wherein said inner part of said first connection region has a doping concentration which at least largely corresponds to a breakdown charge.

8. The junction field-effect transistor according to claim 1, wherein said inner part of said second connection region has doping concentration identical to said inner part of said first connection region.

9. The junction field-effect transistor according to claim 1, wherein said semiconductor region, said first connection region, said second connection region and said source contact region are composed of silicon carbide.

10. The junction field-effect transistor according to claim 9, wherein said inner part of said first connection region has a doping concentration of at most $1 \cdot 10^{18}$ cm$^{-3}$.

11. The junction field-effect transistor according to claim 1, wherein said semiconductor region, said first connection region, said second connection region, and said source contact region are composed of silicon.

12. The junction field-effect transistor according to claim 1, wherein said control region extends along said second surface of said semiconductor region.

13. The junction field-effect transistor according to claim 1, wherein said gate electrode makes ohmic contact with said control region and said second connection region.

14. The junction field-effect transistor according to claim 1, wherein said first connection region has an outer part disposed on said semiconductor region above said control region and said source contact region is disposed on said outer part of said first connection region, and said second connection region has an outer part partly covering said source contact region, with a result that, in an event of a projection perpendicular to said first surface, a projection of said control region and a projection of said outer part of said second connection region overlap.

15. The junction field-effect transistor according to claim 1, wherein said connection region runs parallel to said first surface except for said at least one inner part which runs within said semiconductor region substantially perpendicularly to said first surface.

* * * * *